United States Patent [19]

Moles

[11] 4,238,713
[45] Dec. 9, 1980

[54] VERTICAL DEFLECTION CIRCUIT

[75] Inventor: Warren H. Moles, Flemington, N.J.

[73] Assignee: RCA Corporation, New York, N.Y.

[21] Appl. No.: 51,301

[22] Filed: Jun. 22, 1979

[51] Int. Cl.³ .................. H01J 29/70; H01J 29/76
[52] U.S. Cl. ............................................... 315/397
[58] Field of Search .................. 315/396, 397, 408

[56] References Cited

U.S. PATENT DOCUMENTS

| | | |
|---|---|---|
| 3,774,068 | 11/1973 | Yasumatsuya . |
| 3,784,857 | 1/1974 | Christopher . |
| 3,835,348 | 9/1974 | Rhee . |

*Primary Examiner*—Theodore M. Blum

*Attorney, Agent, or Firm*—Eugene M. Whitacre; Paul J. Rasmussen; Joseph J. Laks

[57] ABSTRACT

A push-pull pair of output transistors provides trace current to a vertical deflection winding. A retrace capacitor forms a resonant retrace circuit with the deflection winding to develop a resonant retrace current in the deflection winding. A damping circuit coupled to the deflection winding damps unwanted oscillations of the trace current. A diode disconnect functions to prevent the resonant retrace current from flowing in both the output stage and in the damping circuit, thereby reducing undesirable dissipation in the vertical deflection circuit.

4 Claims, 2 Drawing Figures

VERTICAL DEFLECTION CIRCUIT

BACKGROUND OF THE INVENTION

This invention relates to vertical deflection circuits.

To provide vertical trace current to a vertical deflection winding, conventional vertical deflection circuits include, for example, two output transistors formed as a push-pull output stage. During vertical retrace, the current in the deflection winding is reversed in direction to be ready for the next trace interval. Typical deflection circuits may use a retrace capacitor coupled to the deflection winding to form a resonant retrace circuit for generating a resonant retrace current. A damping resistor coupled to the deflection winding damps any resonant oscillations of the deflection winding current after resonant retrace has been completed. It is desirable to design the vertical deflection circuit such that, during resonant retrace, the resonant retrace current is prevented from flowing in the output stage and in the damping circuit, thereby eliminating undesirable dissipation.

SUMMARY OF THE INVENTION

Output electrodes of first and second output transistors that are formed into a push-pull output stage are coupled to a deflection winding for providing trace current. A retrace capacitor forms a resonant retrace circuit with the deflection winding. A damping circuit damps oscillations of the trace current and a disconnect circuit prevents the resonant portion of the retrace current from flowing in the output stage and the damping circuit and undesirably dissipating energy during retrace.

DESCRIPTION OF THE INVENTION

Figure 1:
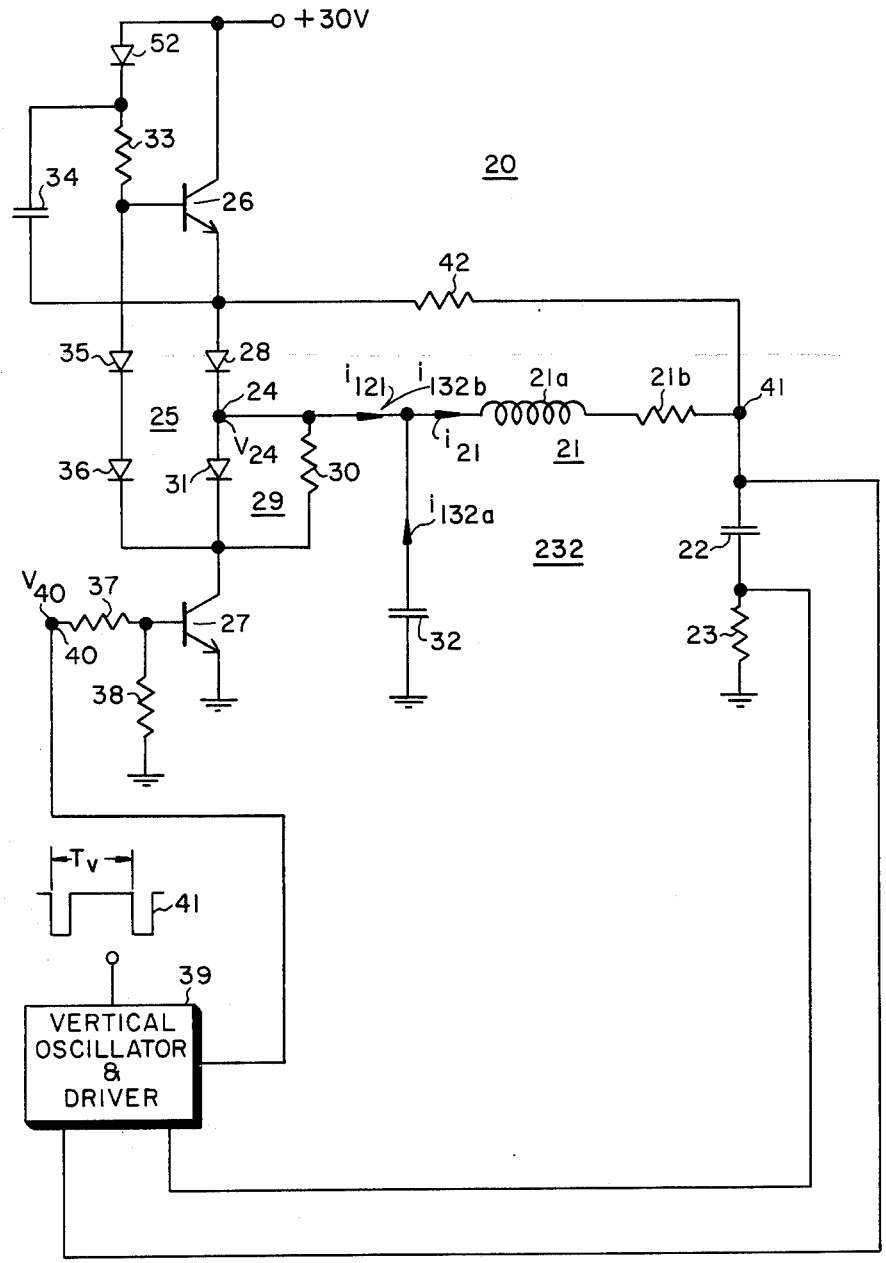
FIG. 1 illustrates a vertical deflection circuit embodying the invention.

A vertical deflection winding 21 of a vertical deflection circuit 20, illustrated in FIG. 1, is coupled to ground through a DC blocking capacitor 22 and an AC feedback resistor 23. Vertical deflection winding 21 comprises an inductive portion 21a and a resistive portion 21b and is coupled to an output terminal 24 of a push-pull output amplifier stage 25. Deflection winding 21 is coupled to a retrace capacitor 32 at output terminal 24.

Push-pull output stage 25 comprises two NPN output transistors 26 and 27 arranged in a stacked or totem pole configuration. The output electrode of transistor 26, the emitter electrode, is coupled through a diode 28 to deflection winding 21 at output terminal 24, and the output electrode of transistor 27, the collector electrode, is coupled through a bias impedance network 29 to deflection winding 21 at terminal 24. Bias impedance network 29 comprises a parallelly coupled resistor 30 and diode 31.

Push-pull output stage 25 is provided with a single-ended supply voltage of +30 volts, illustratively, coupled to the collector of transistor 26. Base current for transistor 26 is obtained from the +30 volt supply through a diode 52 and a resistor 33 and also from a bootstrap capacitor 34, one terminal of which capacitor being coupled to the emitter of transistor 26, the other terminal being coupled to the base of transistor 26 through resistor 33.

A vertical drive signal $V_{40}$ is provided at an input terminal 40 of push-pull output stage 25 from a conventional vertical oscillator and driver circuit 39 that is synchronized by pulses 41 repeating at a vertical deflection rate, $1/T_V$, obtained from a synchronizing circuit, not shown. To maintain a linear trace current in deflection winding 21, an AC feedback voltage developed across resistor 23 is coupled to vertical oscillator and driver 39. A DC feedback voltage is provided by also coupling the voltage across capacitor 22 to vertical oscillator and driver circuit 39.

The vertical drive signal $V_{40}$ at terminal 40 is directly coupled to the base of transistor 27 through a resistor 37 of voltage dividing resistors 37 and 38. Transistor 27 amplifies and inverts vertical drive signal $V_{40}$ at its collector electrode. The inverted drive signal is then coupled to the base of transistor 26 through series coupled diodes 35 and 36.

Figure 2:
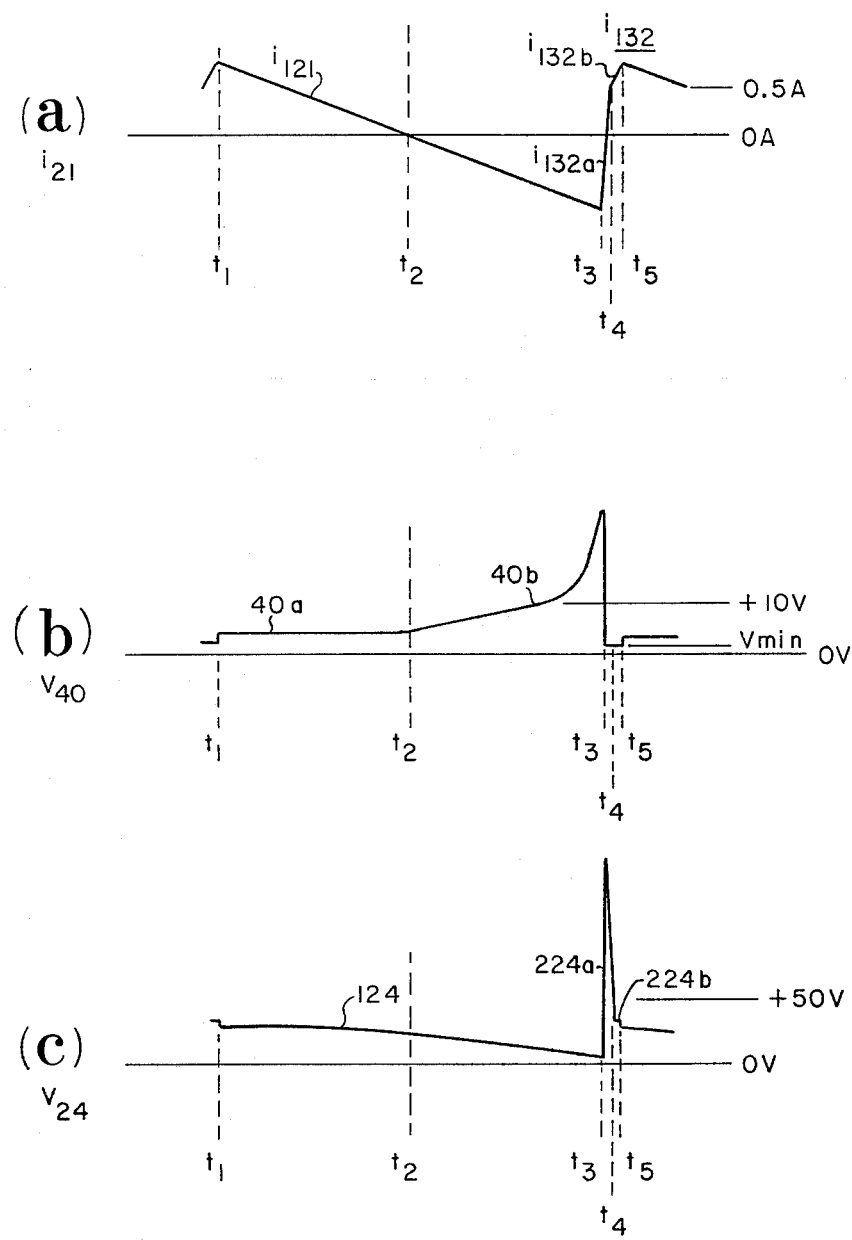
FIG. 2 illustrates waveforms associated with the circuit of FIG. 1.

As illustrated in FIG. 2a, during the trace interval, times $t_1$–$t_3$, the vertical deflection current $i_{21}$ comprises a negative-going sawtooth trace current $i_{121}$. Output transistor 26 conducts vertical deflection trace current mainly during the first half of the trace interval between times $t_1$–$t_2$, whereas output transistor 27 conducts vertical deflection trace current mainly during the second half or latter portion of the trace interval between times $t_2$–$t_3$. Some degree of overlap exists near the center of trace, at time $t_2$, when both output transistors are conducting.

The vertical drive voltage $V_{40}$ at input terminal 40, illustrated in FIG. 2b, is a sawtooth voltage portion 40a of relatively shallow, positive slope during conduction of output transistor 26. Only a shallowly sloped waveform is required because transistor 27 amplifies the drive voltage before it is coupled to the base of transistor 26. The drive voltage increases in magnitude and becomes the waveform 40b, increasingly steep towards the end of trace, when voltage $V_{40}$ must provide relatively large amounts of base current to output transistor 27.

During trace, deflection winding 21 exhibits mainly a resistive impedance, as illustrated in FIG. 2c, by the sloping portion 124 of output voltage $V_{24}$ developed at output terminal 24. Also during trace, bootstrap capacitor 34 charges through diode 52 to a voltage about equal to the difference between the +30 volt supply voltage and the value of output voltage $V_{24}$ at the end of trace. Transistor 26 is reverse biased within the second half of trace when the voltage drop developed across biasing impedance network 29 biases the base-emitter junction of transistor 26 out of conduction.

At the beginning of vertical retrace, near time $t_3$, drive voltage $V_{40}$ decreases to its minimum value $V_{min}$ and remains at substantially this voltage during the retrace interval $t_3$–$t_4$. Transistor 27 is cut off.

Vertical deflection winding 21 and retrace capacitor 32 form a resonant retrace circuit 232 during a resonant retrace portion $t_3$–$t_4$ of the retrace interval. A retrace pulse is developed across retrace capacitor 32 as illustrated in FIG. 2c by the pulse voltage 224a. The retrace current flowing in deflection winding 21 is a sharply rising resonant retrace current portion 132a.

With the voltage at the cathode of diode 28, at terminal 24, sharply increased, diode 28 becomes reverse biased and disconnects the resonant retrace circuit 232 from output transistor 26. Diode 28 thus prevents resonant retrace current from flowing in a reverse conduction path through output transistor 26.

At time $t_4$, the retrace pulse voltage 224a has decreased sufficiently to forward bias diode 28 and the collector-emitter junction of output transistor 26. Bootstrap capacitor 34 provides sufficient base current to transistor 26 to switch the transistor into saturated conduction. Output terminal 24 is thus clamped to the +30 volt supply, as illustrated in FIG. 2c, by the pedestal voltage 224b occurring between times $t_4$-$t_5$, the clamped retrace portion of the retrace interval. Retrace current now flows to deflection winding 21 from the +30 volt supply as illustrated in FIG. 2a by the less sharply positively sloping clamped retrace current $i_{132b}$ between times $t_4$-$t_5$.

The duration of the clamped retrace interval $t_4$-$t_5$, during which the pedestal retrace voltage 224b is developed, is a function of the retrace losses occurring during the resonant retrace interval portion. Increased losses result in an increased clamped retrace interval during which the deflection winding energy previously dissipated is replenished.

Near time $t_5$, the deflection current $i_{21}$ has increased to the required beginning of trace value. Drive voltage $V_{40}$ turns on transistor 27 to begin the subsequent trace interval.

To damp resonant oscillations of the deflection winding current that may begin after the end of the resonant retrace interval portion and which oscillations may undesirably extend into the next trace interval, a terminal of damping resistor 42 is coupled to deflection winding 21 at a terminal 41, the junction of the deflection winding and capacitor 22. Another terminal of damping resistor 42 is coupled to the junction of the emitter electrode of output transistor 26 and the anode of diode 28. Thus, diode 28 functions additionally to disconnect damping resistor 42 from resonant retrace circuit 232 during the resonant retrace interval portion.

Had damping resistor 42 been coupled directly across deflection winding 21, that is to say, had damping resistor 42 been coupled between terminals 24 and 41, resonant retrace current would also flow through damping resistor 42, undesirably dissipating energy during the resonant retrace interval portion. The damped retrace portion would undesirably increase in duration, because the energy replenishment period would be longer. By providing disconnect diode 28 in the manner afordescribed, both output transistor 26 and damping resistor 42 may be isolated from the resonant retrace circuit, significantly increasing the efficiency of vertical deflection circuit 20.

What is claimed is:

1. A deflection circuit, comprising:
   a deflection winding having first and second terminals;
   first and second output transistors with output electrodes coupled to said deflection winding for providing trace current to said deflection winding during a trace interval, said first and second output transistors forming a push-pull output stage;
   a retrace capacitor coupled to said deflection winding for forming a retrace circuit with said deflection winding for generating a resonant retrace current during at least a portion of a retrace interval;
   damping means coupled to said deflection winding for substantially damping current oscillations in said deflection winding during at least the beginning of said trace interval; and
   disconnect means including a diode subject to reverse biasing during said retrace interval portion, a first electrode of said diode being coupled to the emitter electrode of one output transistor of said first and second output transistors and to said damping means and a second electrode of said diode being coupled to said retrace capacitor and to one of said deflection winding terminals for preventing resonant retrace current from flowing in said damping means and in said one output transistor during said retrace interval portion, said disconnect means decoupling said retrace capacitor from the reverse conduction path of said one output transistor during said retrace interval portion to prevent a resonant retrace pulse from being applied thereacross,
   wherein said damping means comprises a resistor directly connected between the other of said deflection winding terminals and said first electrode of said diode and is subject to coupling in parallel with said deflection winding when said diode is forward biased and subject to being decoupled therefrom when said diode is reverse biased during said retrace interval portion.

2. A circuit according to claim 1 wherein the output electrode of the other output transistor is coupled to a control electrode of said one output transistor for coupling a trace drive signal to said one output transistor.

3. A circuit according to claim 2 including a biasing impedance coupled in series with said other output transistor for reverse biasing the base-emitter junction of said one output transistor within the latter portions of the trace interval.

4. A circuit according to claim 3 including a bootstrap capacitor coupled across the base-emitter junction of said one output transistor for providing base current to said one output transistor during initial conduction of said one output transistor during each deflection cycle.

* * * * *